(12) United States Patent
Ahirwar

(10) Patent No.: US 10,340,893 B1
(45) Date of Patent: Jul. 2, 2019

(54) SYSTEMS AND METHODS FOR PROVIDING COMPENSATION OF ANALOG FILTER BANDEDGE RIPPLE USING LPF

(71) Applicant: Marvell International Ltd., Hamilton (BM)

(72) Inventor: Vijay Ahirwar, Bhopal (IN)

(73) Assignee: Marvell International Ltd., Hamilton (BM)

( * ) Notice: Subject to any disclaimer, the term of this patent is extended or adjusted under 35 U.S.C. 154(b) by 92 days.

(21) Appl. No.: 15/782,311

(22) Filed: Oct. 12, 2017

Related U.S. Application Data

(60) Provisional application No. 62/407,058, filed on Oct. 12, 2016.

(51) Int. Cl.
*H03H 21/00* (2006.01)
*H03H 17/02* (2006.01)
*H04B 1/04* (2006.01)
*H03H 17/04* (2006.01)

(52) U.S. Cl.
CPC .......... *H03H 21/00* (2013.01); *H03H 17/025* (2013.01); *H03H 17/0219* (2013.01); *H03H 17/0289* (2013.01); *H03H 17/0416* (2013.01); *H03H 21/0021* (2013.01); *H03H 21/0067* (2013.01); *H04B 1/0475* (2013.01); *H03H 2218/06* (2013.01)

(58) Field of Classification Search
CPC ..... H03H 21/00; H03H 21/0067; H03H 17/02
See application file for complete search history.

(56) References Cited

U.S. PATENT DOCUMENTS

| | | | | |
|---|---|---|---|---|
| 5,745,001 A | * | 4/1998 | Ueshima | H03H 11/1291 327/552 |
| 6,476,685 B1 | * | 11/2002 | Cheung | H03H 7/0115 333/140 |
| 6,901,243 B2 | * | 5/2005 | Jayaraman | H04B 1/1036 375/350 |
| 7,697,645 B2 | * | 4/2010 | Jong | H04B 17/373 370/335 |
| 8,165,255 B2 | * | 4/2012 | Sobchak | H03H 17/0685 370/242 |
| 8,401,128 B2 | * | 3/2013 | Lindoff | H04L 27/3809 375/316 |

* cited by examiner

*Primary Examiner* — Dean O Takaoka
*Assistant Examiner* — Alan Wong

(57) ABSTRACT

A method for compensating the bandedge ripple of an analog filter, using a circuit comprising a low pass filter is described. The method comprises receiving, at the analog filter, a plurality of tones of different frequencies from a tone generator, measuring, an amplitude of each tone in the plurality of tones after each tone is processed by the analog filter, storing the measured amplitudes and frequencies in a database, measuring a bandedge ripple by measuring a difference in amplitude between a first tone and a second tone from the plurality of tones, and selecting a low pass filter, from a plurality of low pass filters, based on the measured difference.

20 Claims, 6 Drawing Sheets

SYSTEMS AND METHODS FOR PROVIDING COMPENSATION OF ANALOG FILTER BANDEDGE RIPPLE USING LPF

CROSS REFERENCE RELATED APPLICATION

This application claims the benefit under 35 U.S.C. § 119(e) of U.S. Provisional Application No. 62/407,058, filed on Oct. 12, 2016 which is hereby incorporated by reference herein in its entirety.

FIELD OF USE

This disclosure is generally directed to improving link sensitivity of circuits by reducing bandedge ripple introduced by analog filters using low pass filters.

BACKGROUND OF DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

Analog filters (e.g., Complex Band Pass Filters) in communication systems may have high bandedge ripple due to component mismatch, among other reasons. The bandedge ripple may also vary based on voltage, temperature, and various parts of the filter. The various parts of the circuit include different IC's or chips. Each chip may be a part. There can be variation in bandedge ripple across chips.

The high bandedge ripple may cause significant degradation in sensitivity of link performance. One solution is not good for all manufactured chips hence the need for online or dynamic compensation of ripple is required.

SUMMARY

In view of the foregoing, systems and methods are provided for providing band edge ripple for analog filter using a low pass filter.

According to one aspect of the disclosure, bandedge ripple of an analog filter, is compensated using a circuit comprising a low pass filter. The analog filter receives a plurality of tones from a tone generator and measures an amplitude of each tone in the plurality of tones after each tone is processed by the analog filter. The measured frequencies and amplitudes are stored in a database. A bandedge ripple is measured using a difference in amplitude between a first tone and a second tone from the plurality of tones, and a low pass filter is selected from a plurality of low pass filters, based on the measured difference.

In some embodiments, the circuit comprises the analog filter functions in at least one of a normal mode and a calibration mode. In some embodiments, the selected low pass filter is applied in the normal mode of the analog filter to compensate for the bandedge ripple. In some embodiments, a system controller, switches the circuit from the normal mode to the calibration mode when the system controller detects no data transaction at the analog filter, and the selection of the low pass filter is performed in the calibration mode.

In some embodiments, while the circuit functions in the calibration mode, the frequency of each tone in the plurality of tones is a fixed step-wise increase from the frequency of the first tone to the frequency of the second tone. In some embodiments, while the circuit functions in the calibration mode, the selection of the low pass filter depends on a magnitude of the difference in the amplitudes of the first tone and the second tone. In some embodiments, while the circuit functions in the calibration mode the selected low pass filter reduces the bandedge ripple to a first magnitude, that is lower than a second magnitude of the difference between the frequency of the first tone and the second tone.

In some embodiments, each of the plurality of tones is converted from analog to digital after passing through the analog filter. In some embodiments, the selected low pass filter is a digital filter that reduces the bandedge ripple after the conversion of each of the plurality of tones from analog to digital. In some embodiments, the selected low pass filter is an analog filter that reduces the bandedge ripple before the conversion of each tone from analog to digital.

BRIEF DESCRIPTION OF DRAWINGS

Further features of the disclosure, its nature and various advantages will be apparent upon consideration of the following detailed description, taken in conjunction with the accompanying drawings, in which.

DETAILED DESCRIPTION

To provide an overall understanding of the disclosure, certain illustrative embodiments will now be described in connection with systems and methods for compensating bandedge ripple using a low pass filter. However, the systems and methods described herein may be adapted and modified as appropriate for the application being addressed and the systems and methods described herein may be employed in other suitable applications, and that such other additions and modifications will not depart from the scope thereof.

Figure 1:
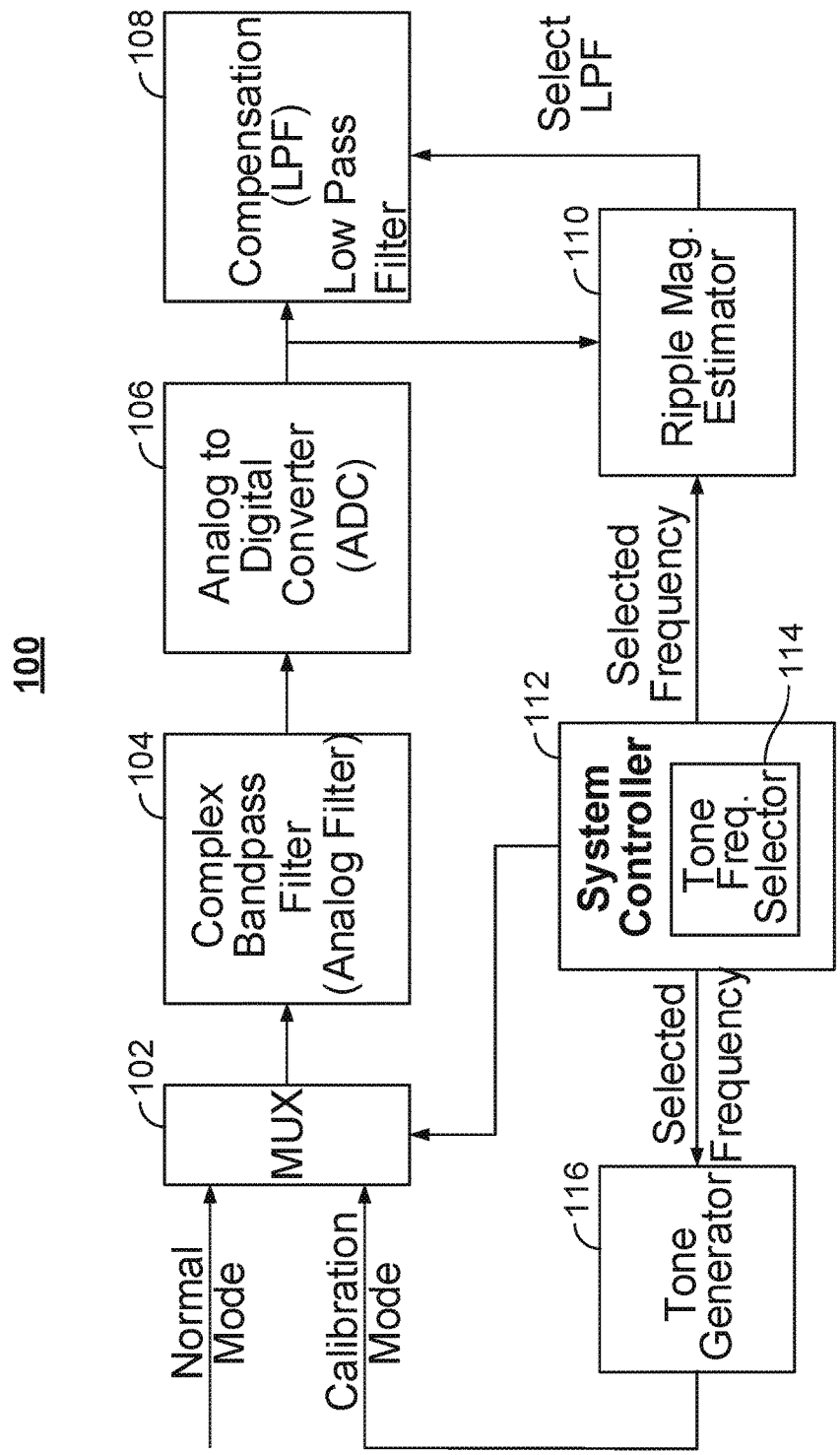
FIG. 1 shows a schematic diagram of an illustrative system that compensates bandedge ripple of an analog filter using a low pass filter, in accordance with an embodiment of the present disclosure.

FIG. 1 shows a schematic diagram of an illustrative system 100 that compensates bandedge ripple of an analog filter using a low pass filter, in accordance with an embodiment of the present disclosure. System 100 in FIG. 1 includes a multiplexer (MUX) 102, complex bandpass filter (also known as analog filter) 104, analog to digital convertor (ADC) 106, compensation low pass filter (LPF) 108, system controller 112, ripple magnitude estimator 110, and tone generator 116. Incoming signals received by system 100 and processed by analog filter 104 may have a bandedge ripple introduced by analog filter 104 during processing. System 100 is used to identify a compensation LPF 108 that may be used to compensate the bandedge ripple introduced when analog filter 104 processes incoming signals. In some embodiments, the system controller 112 includes one or more various circuitries such as control circuitry, encoding circuitry, decoding circuitry, transmission circuitry, receiving circuitry, memory circuitry, processing circuitry and integrated circuitry that may combine the various circuitries together. The functions discussed in this disclosure with respect to system controller 112 may be performed by control circuitry or any combination of the other circuitries that form part of system controller 112. In some embodiments, analog filter 104 includes one or more various circuitries such as control circuitry, encoding circuitry, decoding circuitry, transmission circuitry, receiving circuitry, memory circuitry, processing circuitry and integrated circuitry that may combine the various circuitries together. The functions discussed in this disclosure with respect to analog filter may be performed by control circuitry or any combination of the other circuitries that form part of analog filter 104.

System 100 may function in at least two modes, a normal mode and a calibration mode. System controller 112 is responsible for controlling a mode of operation of system 100. System controller 112 controls a mode of operation of system 100 by modifying a selection bit on MUX 102 that selects the input stream for analog filter 104. When system controller 112 detects data transmission to analog filter 104 over a radio frequency, system controller 112 switches the mode of operation of system 100 to normal mode. The data received in normal mode at MUX 102 is processed by analog filter 104 and converted from analog form to digital form using an analog to digital convertor (ADC) 106. The converted signal is then passed through a compensation low pass filter (LPF) 108 to eliminate the bandedge ripple introduced by analog filter 104. In some embodiments, the bandedge ripple may not be completely eliminated but will be reduced.

Upon detecting that no data is being transmitted to system 100, system controller 112 switches the mode of operation of system 100 from normal mode to calibration mode. Calibration mode is used to select a compensation LPF 108 to reduce the bandedge ripple introduced by analog filter 104 in normal mode of operation. In calibration mode, tone frequency selector 114 in system controller 112 selects a range of frequencies and sends them to a tone generator 116. Tone generator 116 generates a tone for each frequency in the range of frequencies and provides each frequency as an input to analog filter 104. In some embodiments, tone frequency selector 114 may sweep a range of frequencies starting from a first frequency and increasing the frequency by a fixed value until reaching a second frequency for calibrating the system 100. Analog filter 104 processes each frequency in the range of frequencies and each processed frequency is converted from analog to digital form by ADC 106. The converted processed frequency is sent to ripple magnitude estimator 110. Ripple magnitude estimator 110 stores each converted processed frequency value to calculate a bandedge ripple created by analog filter 104. Ripple magnitude estimator calculates bandedge ripple of analog filter 104 by determining the response of analog filter 104 over the range of frequencies received and processed by analog filter 104 using the stored values. In some embodiments, the bandedge ripple may be calculated by determining a difference between any two converted processed frequency values received at ripple magnitude estimator 110. Calculation of bandedge ripple is described in more detail in FIG. 2.

Based on the calculated ripple magnitude calculated by ripple magnitude estimator 110, an appropriate compensation low pass filter 108 is selected to reduce the bandedge ripple created by the analog filter 104. In some embodiments, low pass filter may be a digital filter used to reduce the bandedge ripple after the conversion of the signal from analog to digital using ADC 106. In some embodiments, the compensation LPF 108 may be an analog filter that is used to reduce the bandedge ripple produced by analog filter 104 before the conversion of the signal from analog to digital using ADC 106. The selection of compensation LPF 108 is described in more detail in FIG. 2.

In some embodiments, ADC 106 includes one or more various circuitries such as control circuitry, encoding circuitry, decoding circuitry, transmission circuitry, receiving circuitry, memory circuitry, processing circuitry and integrated circuitry that may combine the various circuitries together. The functions discussed in this disclosure with respect to ADC 106 may be performed by control circuitry or any combination of the other circuitries that form part of ADC 106. In some embodiments, LPF 108 includes one or more various circuitries such as control circuitry, encoding circuitry, decoding circuitry, transmission circuitry, receiving circuitry, memory circuitry, processing circuitry and integrated circuitry that may combine the various circuitries together. The functions discussed in this disclosure with respect to LPF 108 may be performed by control circuitry or any combination of the other circuitries that form part of LPF 108.

In some embodiments, ripple magnitude estimator 110 includes one or more various circuitries such as control circuitry, encoding circuitry, decoding circuitry, transmission circuitry, receiving circuitry, memory circuitry, processing circuitry and integrated circuitry that may combine the various circuitries together. The functions discussed in this disclosure with respect to ripple magnitude estimator 110 may be performed by control circuitry or any combination of the other circuitries that form part of ripple magnitude estimator 110.

Figure 2:
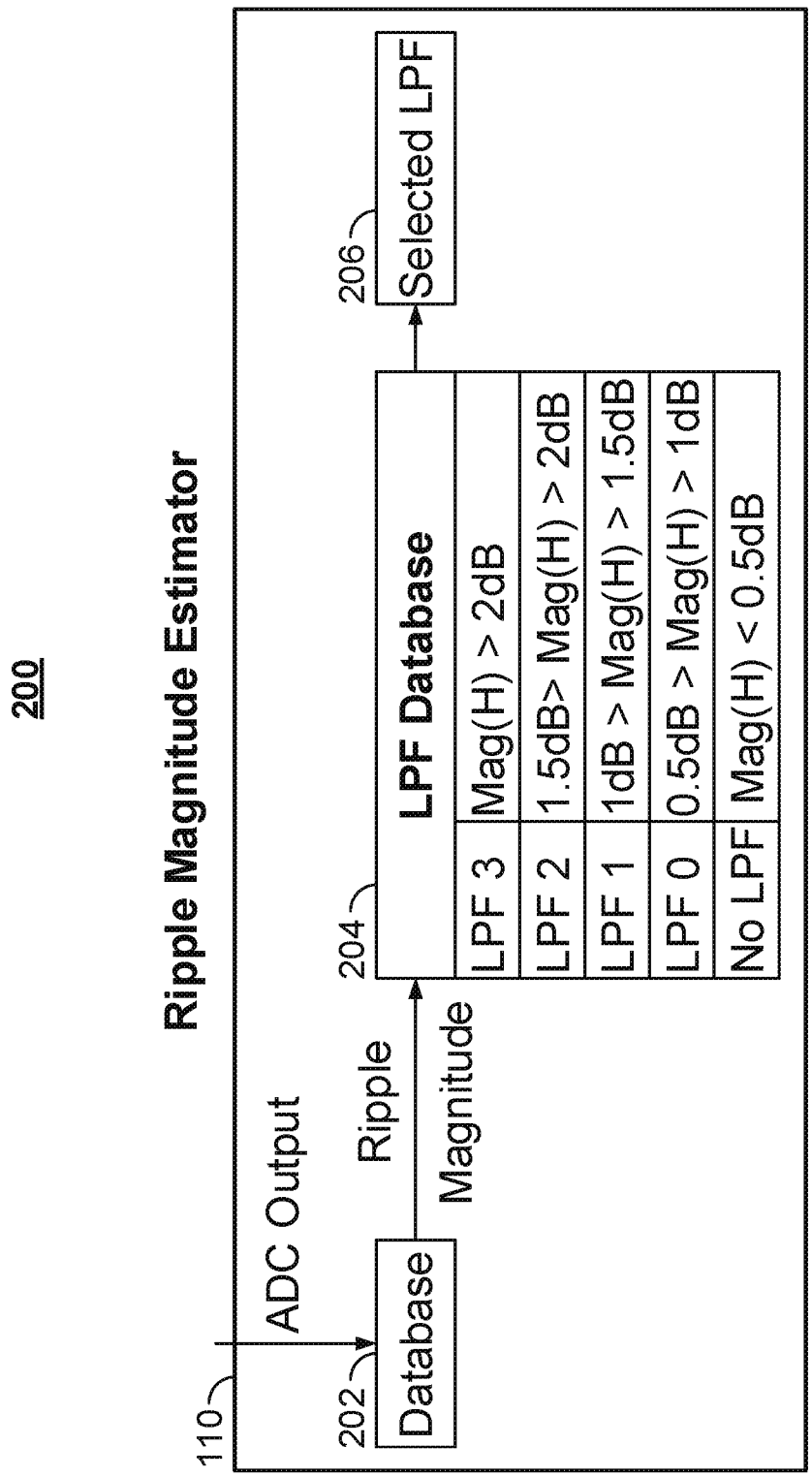
FIG. 2 shows a schematic diagram of an illustrative system that estimates bandedge ripple of an analog filter and selects a low pass filter to compensate the bandedge ripple, in accordance with an embodiment of the present disclosure.

FIG. 2 shows a schematic diagram of an illustrative system that estimates bandedge ripple of an analog filter and selects a low pass filter to compensate the bandedge ripple, in accordance with an embodiment of the present disclosure. System 200 in FIG. 2 contains a database 202, an LPF database 204 and a selected LPF 206. Database 202 of ripple magnitude estimator 110 receives output from ADC 106 of system 100 and stores the received values in database 202. Ripple magnitude estimator 110 estimates a bandedge ripple of the analog filter by calculating a difference between any two amplitude values of the plurality of values provided by tone generator 116 and processed by analog filter 104. The magnitude of the ripple estimated (also depicted as Mag(H) in FIG. 2) is used to pick a low pass filter from a database of filters LPF Database 204. LPF Database 204 contains a plurality of filters (LPF 0, LPF 1, LPF 2, and LPF 3). The various filters in LPF Database 204 may be used to compensate the ripple bandedge introduced by analog filter 104. Ripple magnitude estimator 110 may select a low pass filter based on the magnitude of ripple calculated (Mag(H)). For example, in case Mag(H) is greater than 2 dB, LPF 3 is selected, which is the filter that introduces the steepest compensation to the bandedge ripple generated by analog filter 104. Similarly, based on the computed ripple magnitude, any one of LPF 0, LPF, 1, LPF 2, may be selected to compensate for the bandedge ripple introduced by analog filter 104. In some embodiments, if the computed ripple magnitude is below a certain threshold, no LPF may be selected as the ripple may be too small to be compensated. Selected LPF 206 is finally sent to system 100 to compensate for bandedge ripple during operation in normal mode as described in FIG. 1.

Figure 3:
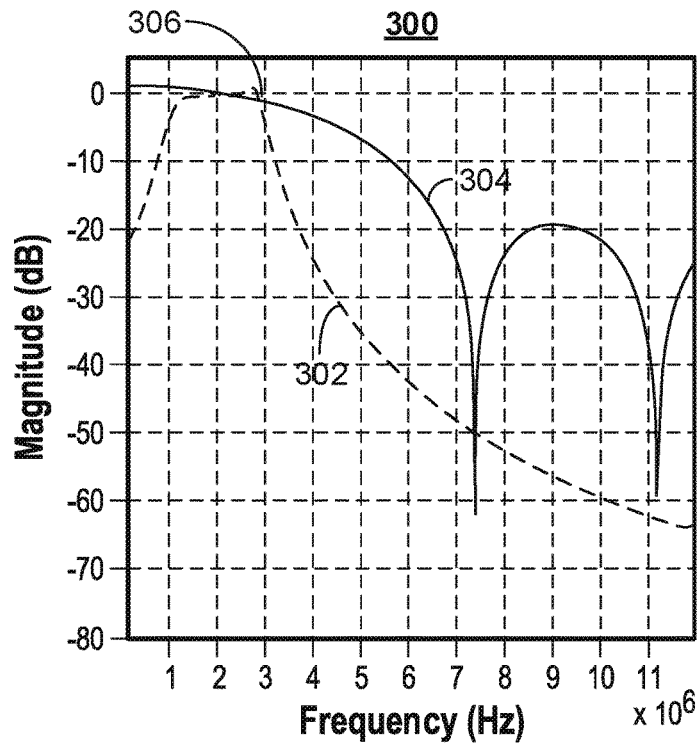
FIG. 3 is a graphical representation of a signal and a low pass filter, in accordance with an embodiment of the present disclosure.

FIG. 3 is a graphical representation of a signal 302 and a low pass filter 304, in accordance with an embodiment of the present disclosure. Original signal 302 has a bandedge ripple 306, that is introduced by analog filter 104. In some embodiments, when the low pass filter curve 304 is superimposed over signal 302, low pass filter 304 may filter out the bandedge ripple 306 from signal 302.

Figure 4:
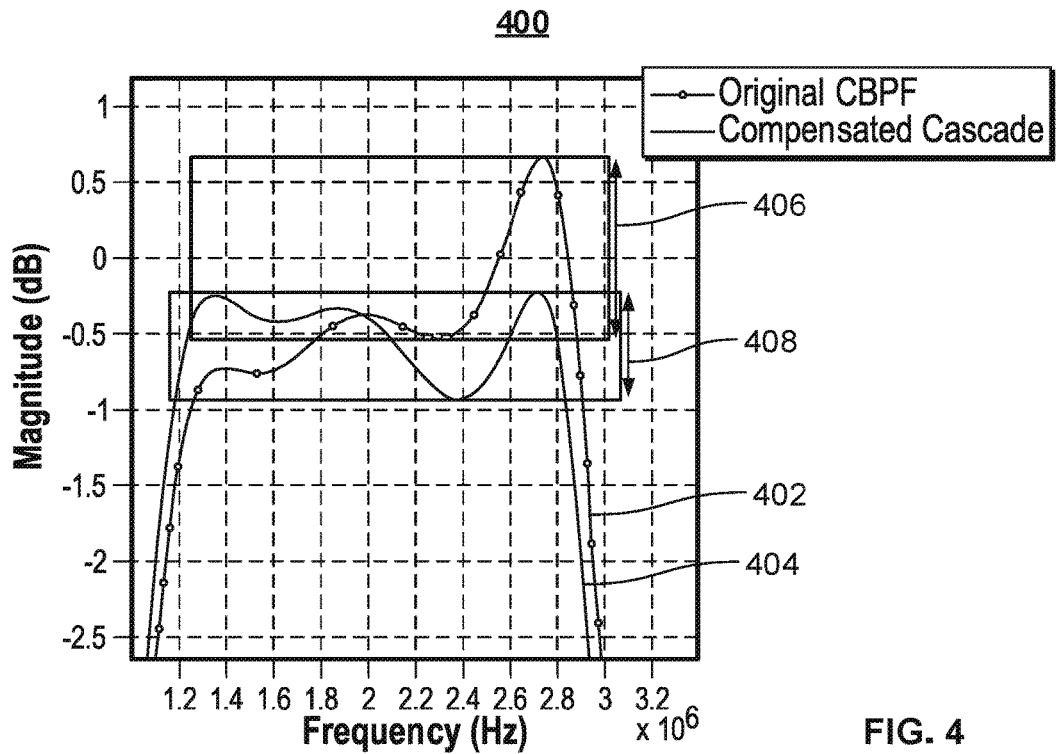
FIG. 4 is a graphical representation of an original signal and a version of the original signal that is compensated cascade to reduce the bandedge ripple using a low pass filter, in accordance with an embodiment of the present disclosure.

FIG. 4 is a graphical representation of an original signal 402 and a version of the original signal 402 that is compensated cascade 404 to reduce the bandedge ripple using a low pass filter, in accordance with an embodiment of the present disclosure. Compensated cascade 404 of signal 402 is achieved by superimposing a low pass filter over original signal 402. Original signal 402 has a peak-to-peak bandedge ripple 406 introduced by analog filter 104. Compensated cascade 404 has a peak-to-peak bandedge ripple 408 that is lower in magnitude than the bandedge ripple of original signal 402.

Figure 5:
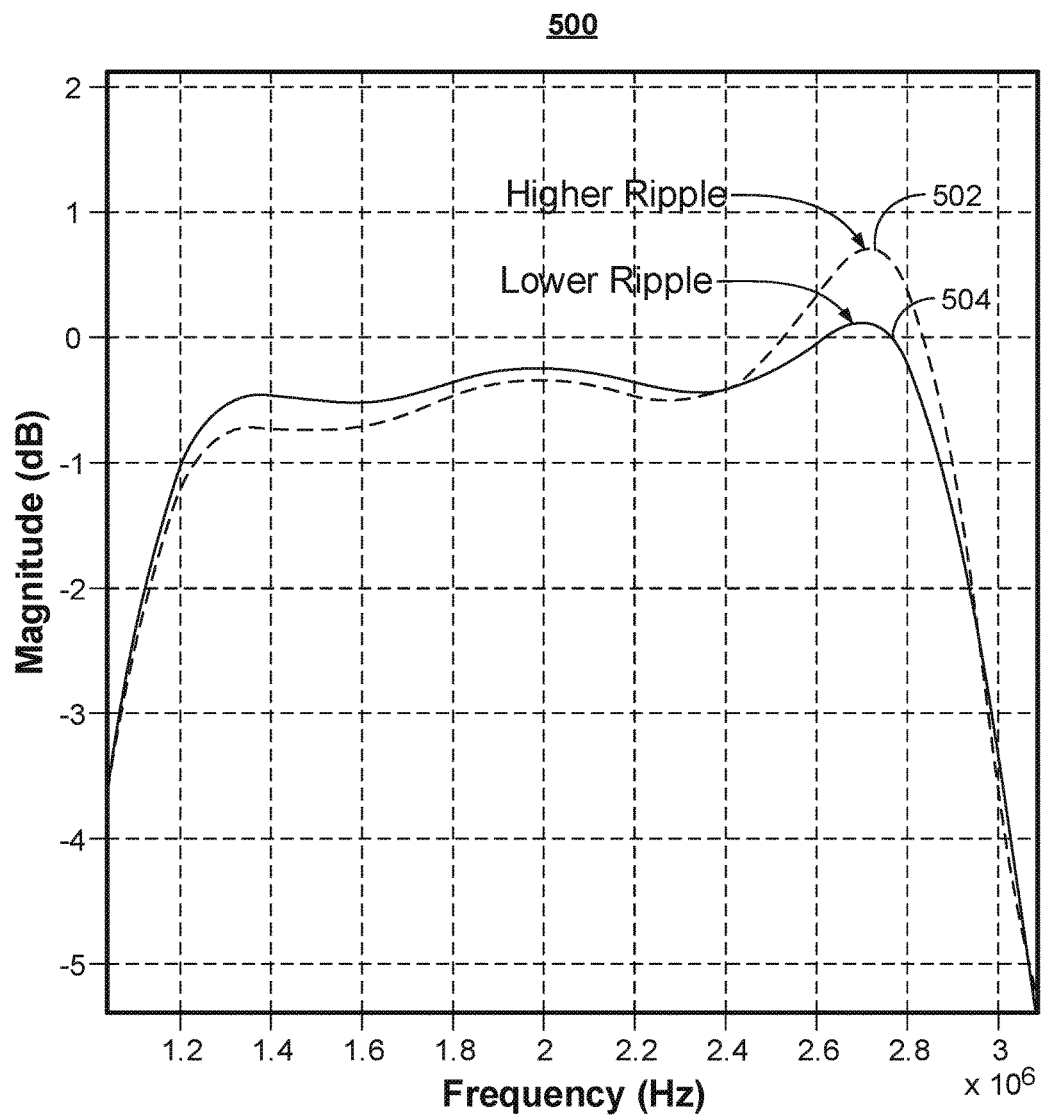
FIG. 5 is a depiction of different ripples introduced by analog filter, in accordance with an embodiment of the present disclosure.

FIG. 5 is a depiction of different ripples introduced by analog filter 104. In some embodiments, the different ripples 502, 504 may be produced from the same signal, or may be from different signals. In some embodiments, the difference in the magnitude of the ripple may vary based on the parts used, temperature, or voltage. Higher ripple 502 requires a sharper compensation LPF and lower ripple 504 requires a flatter compensation LPF. In some embodiments, ripple magnitude estimator 110 contains LPF database 204 with multiple compensation LPFs to choose from depending on determined ripple magnitude.

Figure 6:
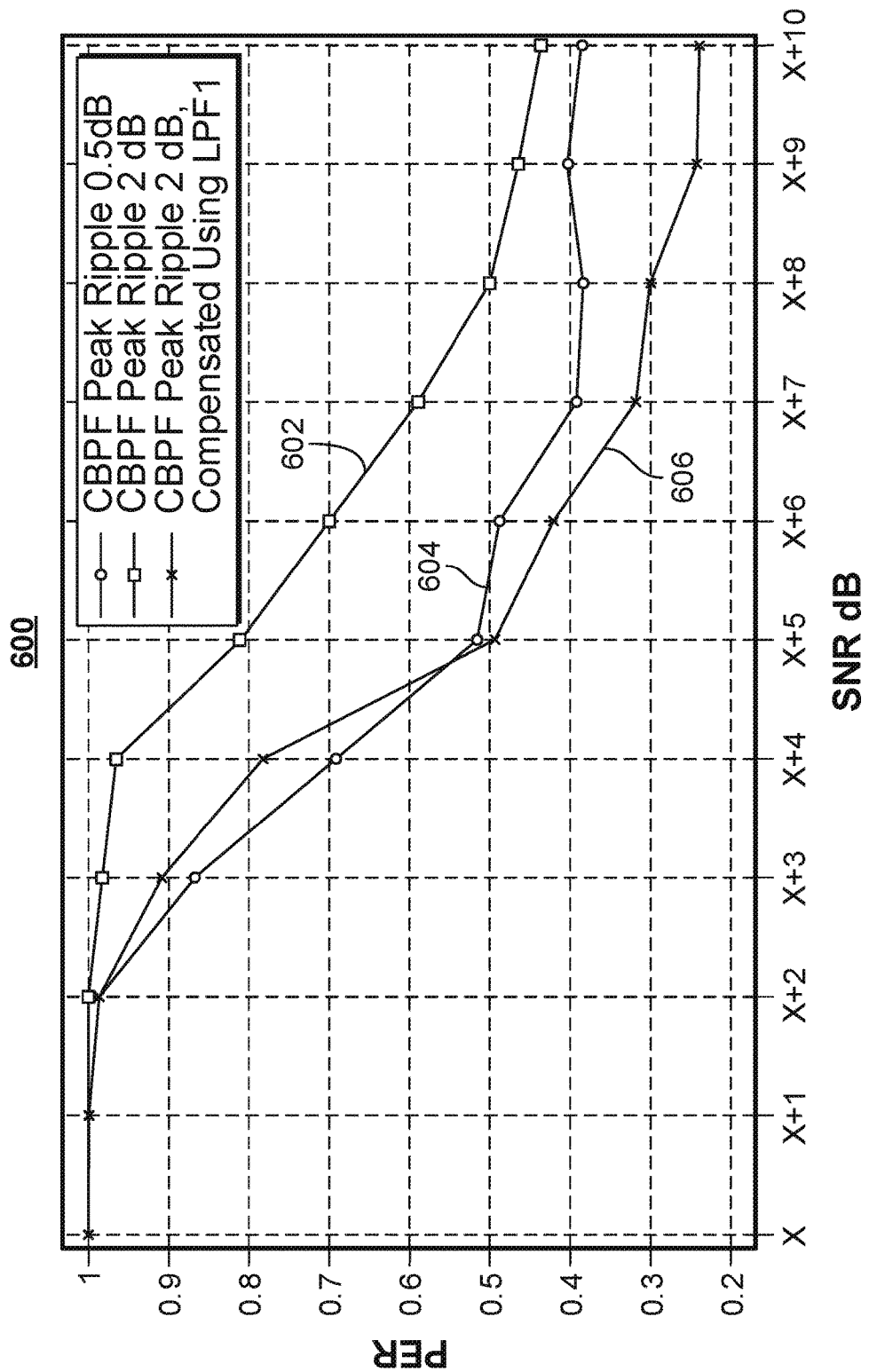
FIG. 6 is a depiction of a graph that shows a plot of a packet error rate (PER) versus a signal to noise ratio (SNR) of signals with various peak-to-peak ripples, in accordance with an embodiment of the present disclosure.

FIG. 6 is a depiction of a graph that shows a plot of a packet error rate (PER) versus a signal to noise ratio (SNR) of signals 602, 604, and 606 with various peak-to-peak ripples, in accordance with an embodiment of the present disclosure. Graph 604 is a plot of a PER v. SNR of a signal that has a peak-to-peak ripple of 0.5 dB. Graph 602 is a plot of a PER v. SNR of a signal that has a peak-to-peak ripple of 2 dB. In some embodiments, the higher peak-to-peak ripple leads to a higher PER for the same SNR. Graph 606 depicts a compensated cascade of graph 604 using a low pass filter (LPF 1). Graph 606 shows a much lower PER than graph 602 for the same SNR. This shows that the compensated cascade of the signal with peak-to-peak ripple of 2 dB is almost similar to the PER of the graph 604 with a peak-to-peak ripple of 0.5 dB. Thus, the compensated cascade signal is more optimized than the original signal.

Figure 7:
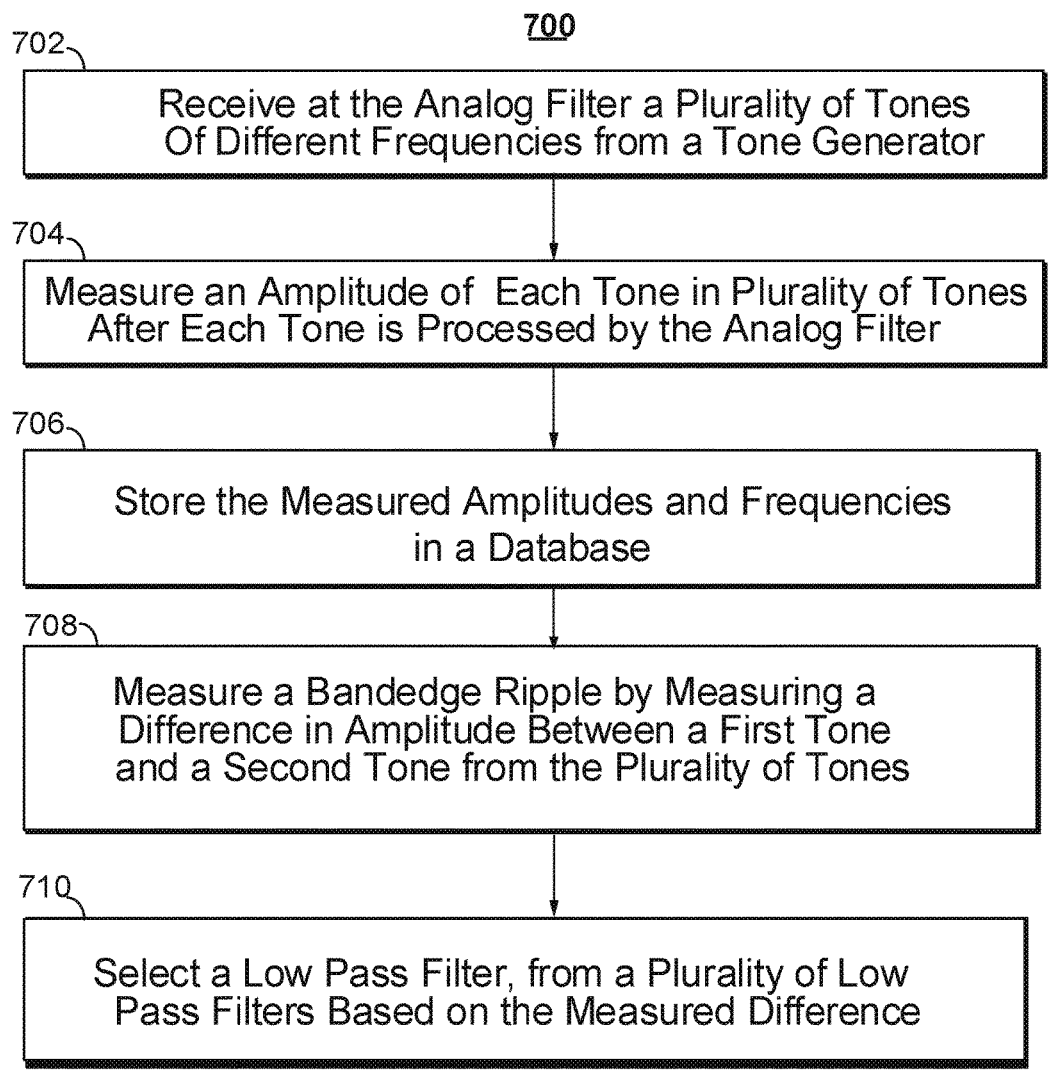
FIG. 7 shows a flow diagram for compensating the bandedge ripple using a low pass filter, in accordance with an embodiment of the present disclosure.

FIG. 7 shows a flow diagram of a process 700 to compensate a bandedge ripple using a low pass filter in accordance with an embodiment of the present disclosure. At 702, analog filter 104 receives a plurality of tones of different frequencies from tone generator 116. For example, tone generator 116 receives a request from tone frequency selector 114 of system controller 112 to generate a plurality of tones having different frequencies, starting at a first frequency and increasing the frequency by a constant amount until a second frequency is reached.

At 704, an amplitude of each tone in the plurality of tones is measured after each tone is processed by analog filter 104. As described in FIG. 2, ripple magnitude estimator 110 measures amplitudes and frequencies received after the frequencies area processed by analog filter 104. The measured frequencies and amplitudes are stored in ripple magnitude estimator as described in 706.

At 706, the measured frequencies and amplitudes are stored in a database 202. As described in FIG. 2, measured frequencies and amplitudes after processing by analog filter 104 are stored in a database 202 in ripple magnitude estimator 110.

At 708, a bandedge ripple is measured by measuring a difference in amplitude between a first tone and a second tone from the plurality of tones. The bandedge ripple is calculated by ripple magnitude estimator 110. Ripple magnitude estimator 110 measures the bandedge ripple by determining a difference between any two amplitude values associated with frequency values received at ripple magnitude estimator 110 from analog filter 104. In some embodiments, the two values selected, may be the largest frequency and the smallest frequency of the plurality of tones. The measurement of the bandedge ripple is described in more detail with respect to FIG. 2.

At 710, a low pass filter is selected, from a plurality of low pass filters based on the measured difference. The selected low pass filter is applied to the system 100 to reduce the bandedge ripple introduced by analog filter 104.

In some embodiments, any instructions for performing any of the embodiments discussed herein may be encoded on computer readable media. Computer readable media includes any media capable of storing data. The computer readable media may be transitory, including, but not limited to, propagating electrical or electromagnetic signals, or may be non-transitory including, but not limited to, volatile and nonvolatile computer memory or storage devices such as a hard disk, floppy disk, USB drive, DVD, CD, media card, register memory, processor caches, Random Access Memory ("RAM"), etc.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method for compensating the bandedge ripple of an analog filter, using a circuit comprising a low pass filter, the method comprising:
   receiving, at the analog filter, a plurality of tones of different frequencies from a tone generator;
   measuring, an amplitude of each tone in the plurality of tones after each tone is processed by the analog filter;
   storing the measured amplitudes and frequencies in a database;
   measuring a bandedge ripple by measuring a difference in amplitude between a first tone and a second tone from the plurality of tones; and
   selecting a low pass filter, from a plurality of low pass filters, based on the measured difference.

2. The method of claim 1, wherein the circuit comprising the analog filter functions in at least one of a normal mode and a calibration mode.

3. The method of claim 2, wherein the selected low pass filter is applied in the normal mode of the analog filter to compensate for the bandedge ripple.

4. The method of claim 2, wherein a system controller, switches the circuit from the normal mode to the calibration mode when the system controller detects no data transaction at the analog filter; and the selection of the low pass filter is performed in the calibration mode.

5. The method of claim 4, wherein while the circuit functions in the calibration mode, the frequency of each tone in the plurality of tones is a fixed step-wise increase from the frequency of the first tone to the frequency of the second tone.

6. The method of claim 4, wherein while the circuit functions in the calibration mode, the selection of the low pass filter depends on a magnitude of the amplitude difference in the frequencies of the first tone and the second tone.

7. The method of claim 4, wherein while the circuit functions in the calibration mode the selected low pass filter reduces the bandedge ripple to a first amplitude magnitude, that is lower than a second amplitude magnitude of the difference between the first tone and the second tone.

8. The method of claim 1, wherein each of the plurality of tones is converted from analog to digital after passing through the analog filter.

9. The method of claim 8, wherein the selected low pass filter is a digital filter that reduces the bandedge ripple after the conversion of each of the plurality of tones from analog to digital.

10. The method of claim 8, wherein the selected low pass filter is an analog filter that reduces the bandedge ripple before the conversion of each tone from analog to digital.

11. A system for compensating the bandedge ripple of an analog filter, using a low pass filter, the system comprising control circuitry configured to:

receive, at the analog filter, a plurality of tones of different frequencies from a tone generator;

measure, an amplitude of each tone in the plurality of tones after each tone is processed by the analog filter;

store the measured amplitudes and frequencies in a database;

measure a bandedge ripple by measuring a difference in amplitude between a first tone and a second tone from the plurality of tones; and select a low pass filter, from a plurality of low pass filters, based on the measured difference.

12. The system of claim 11, wherein the control circuitry functions in at least one of a normal mode and a calibration mode.

13. The system of claim 12, wherein the selected low pass filter is applied in the normal mode of the analog filter to compensate for the bandedge ripple.

14. The system of claim 12, wherein the control circuitry is configured to switch the control circuitry from the normal mode to the calibration mode when the system controller detects no data transaction at the analog filter; and the control circuitry selects the low pass filter in the calibration mode.

15. The system of claim 11, wherein while the control circuitry functions in the calibration mode, the frequency of each tone in the plurality of tones is a fixed step-wise increase from the frequency of the first tone to the frequency of the second tone.

16. The system of claim 11, wherein while the control circuitry functions in the calibration mode, the selection of the low pass filter depends on a magnitude of the difference in the amplitudes of the first tone and the second tone.

17. The system of claim 11, wherein while the circuit functions in the calibration mode, the selected low pass filter reduces the bandedge ripple to a first magnitude, that is lower than a second magnitude of the difference between the amplitude of the first tone and the second tone.

18. The system of claim 11, wherein each of the plurality of tones is converted from analog to digital after passing through the analog filter.

19. The system of claim 18, wherein the selected low pass filter is a digital filter that reduces the bandedge ripple after the conversion of each of the plurality of tones from analog to digital.

20. The system of claim 18, wherein the selected low pass filter is an analog filter that reduces the bandedge ripple before the conversion of each tone from analog to digital.

* * * * *